United States Patent
Choi et al.

(10) Patent No.: US 9,001,572 B2
(45) Date of Patent: Apr. 7, 2015

(54) SYSTEM ON CHIP INCLUDING DUAL POWER RAIL AND VOLTAGE SUPPLY METHOD THEREOF

(71) Applicant: Samsung Electronics Co., Ltd., Suwon-Si, Gyeonggi-Do (KR)

(72) Inventors: Hyunsu Choi, Suwon-si (KR); Jaeseung Choi, Suwon-si (KR); Gyuhong Kim, Seocho-gu (KR); Dong-Wook Seo, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/255,638

(22) Filed: Apr. 17, 2014

(65) Prior Publication Data

US 2014/0313819 A1 Oct. 23, 2014

(30) Foreign Application Priority Data

Apr. 19, 2013 (KR) .................. 10-2013-0043649

(51) Int. Cl.
  *G11C 16/04* (2006.01)
  *G11C 11/419* (2006.01)
  *G11C 5/14* (2006.01)

(52) U.S. Cl.
  CPC ............. *G11C 11/419* (2013.01); *G11C 5/14* (2013.01)

(58) Field of Classification Search
  CPC ............................. G11C 16/04; G11C 16/30
  USPC ............................. 365/185.03, 185.23, 226
  See application file for complete search history.

(56) References Cited

U.S. PATENT DOCUMENTS

| | | | |
|---|---|---|---|
| 6,426,908 B1 | 7/2002 | Hidaka | |
| 7,313,032 B2 | 12/2007 | Ellis et al. | |
| 7,474,582 B2 | 1/2009 | Mair et al. | |
| 7,545,670 B2 | 6/2009 | Tokito et al. | |
| 7,598,794 B1 * | 10/2009 | Stansell et al. | 327/534 |
| 8,077,517 B2 | 12/2011 | Wang et al. | |
| 8,605,534 B2 * | 12/2013 | Lee et al. | 365/227 |
| 2006/0152966 A1 | 7/2006 | Park | |
| 2011/0063895 A1 * | 3/2011 | Komatsu et al. | 365/156 |
| 2011/0188326 A1 | 8/2011 | Lee et al. | |
| 2011/0205787 A1 | 8/2011 | Salters et al. | |

(Continued)

FOREIGN PATENT DOCUMENTS

| | | |
|---|---|---|
| JP | 2001-052476 | 2/2001 |
| JP | 2009-076169 | 4/2009 |

(Continued)

OTHER PUBLICATIONS

English Abstract Publication No. 10-2006-0082565 (For 10-0610020).

*Primary Examiner* — Hoai V Ho
*Assistant Examiner* — Muna Techane
(74) *Attorney, Agent, or Firm* — F. Chau & Associates, LLC

(57) ABSTRACT

A system on chip includes an SRAM. The SRAM includes at least one memory cell and a peripheral circuit accessing the at least memory cell. A first power circuit is configured to supply a first driving voltage to the at least one memory cell. A second power circuit is configured to supply a second driving voltage to the peripheral circuit. The SRAM further includes an auto power switch that selects the higher of the first driving voltage and the second driving voltage and supplies the selected voltage to the at least one memory cell.

18 Claims, 15 Drawing Sheets

(56) References Cited

U.S. PATENT DOCUMENTS

2011/0205827 A1\* 8/2011 Agata et al. .................. 365/226
2012/0140578 A1\* 6/2012 Goto et al. ............... 365/189.07
2013/0114338 A1\* 5/2013 Park et al. ................ 365/185.03

FOREIGN PATENT DOCUMENTS

| | | |
|---|---|---|
| JP | 2010-192013 | 9/2010 |
| JP | 2011-060401 | 3/2011 |
| KR | 10-0610020 | 8/2006 |

\* cited by examiner

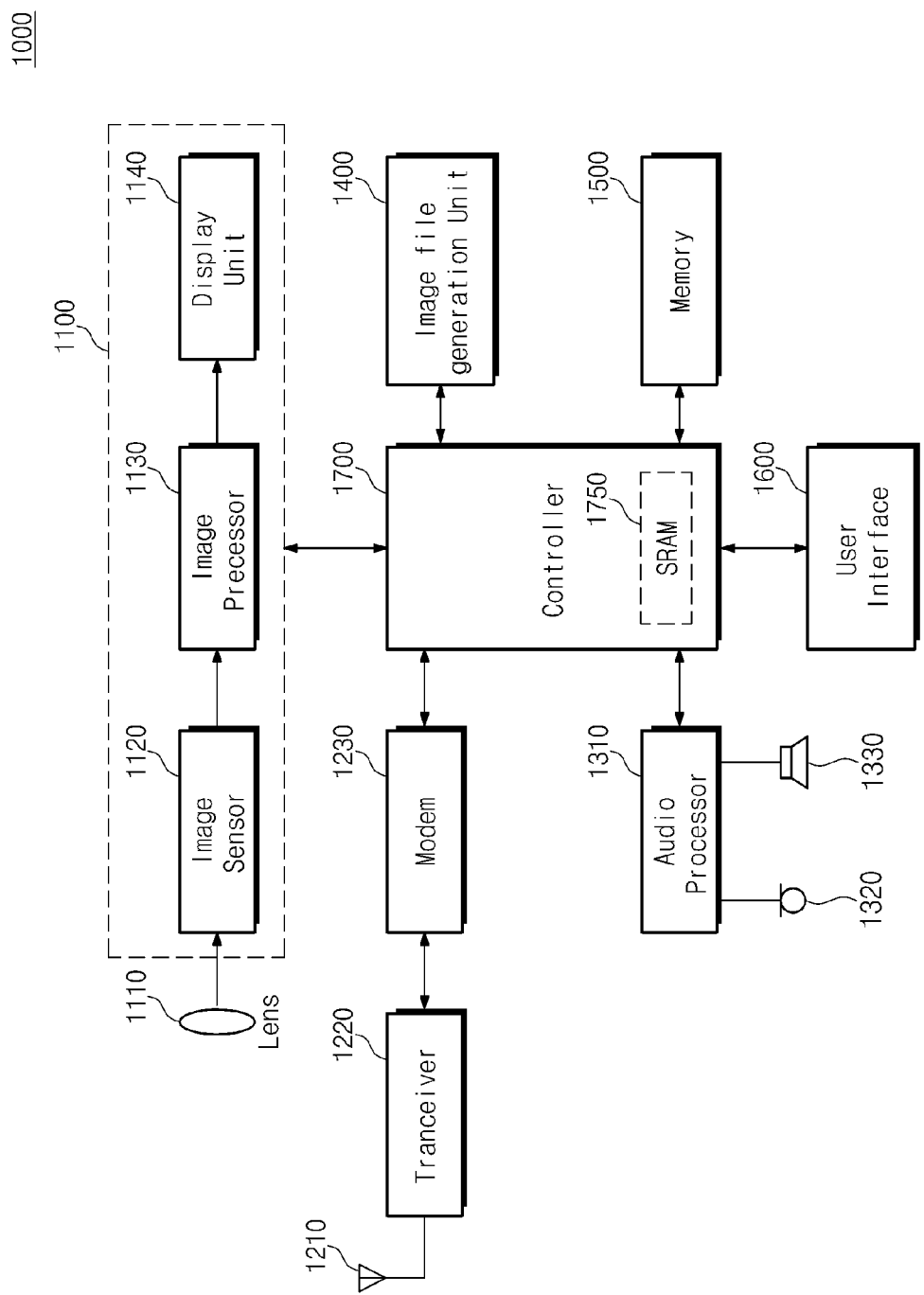

SYSTEM ON CHIP INCLUDING DUAL POWER RAIL AND VOLTAGE SUPPLY METHOD THEREOF

CROSS-REFERENCE TO RELATED APPLICATIONS

This non-provisional application claims priority under 35 U.S.C. §119 to Korean Patent Application No. 10-2013-0043649 filed Apr. 19, 2013, in the Korean Intellectual Property Office, the disclosure of which is incorporated by reference herein in its entirety.

TECHNICAL FIELD

The inventive concept relates to a semiconductor device, and more particularly, to a system on chip including an SRAM.

DISCUSSION OF RELATED ART

A semiconductor device, e.g., an application processor, includes a system on chip including a plurality of functional blocks (or intellectual property (IP) cores). A system on chip includes an SRAM that may be used as a cache or buffer memory. A voltage provided for powering cells is higher than a voltage provided to other control blocks in order to secure a read margin for the SRAM. A dual power rail scheme may be adopted for an SRAM that includes IP cores so as to provide different levels of power.

Stably power supply to a semiconductor device is critical for reliable operation of the device. The power supply may be influenced by external noise or process variation, thus resulting in a malfunction of the SRAM.

SUMMARY

An exemplary embodiment of the inventive concept provides a system on chip which comprises an SRAM. The SRAM includes at least one memory cell and a peripheral circuit accessing the at least memory cell. A first power circuit is configured to supply a first driving voltage to the at least one memory cell. A second power circuit is configured to supply a second driving voltage to the peripheral circuit. The SRAM further includes an auto power switch that is configured to select the higher of the first driving voltage and the second driving voltage and supplies the selected voltage to the at least one memory cell.

An exemplary embodiment of the inventive concept provides a method of supplying a power to an SRAM. The SRAM is separately supplied with a cell driving voltage that is to be supplied to a memory cell and a peripheral driving voltage that is to be supplied to a peripheral circuit accessing the memory cell. In the method, a performance mode of the SRAM is detected. The cell driving voltage is compared with the peripheral driving voltage. The cell driving voltage or the peripheral driving voltage is selected according to a result of the comparison. The selected voltage is supplied as a power supply voltage of the cell array. The selected voltage corresponds to the higher of the cell driving voltage and the peripheral driving voltage or to a voltage having substantially the same level as the cell driving voltage and the peripheral driving voltage.

An exemplary embodiment of the inventive concept provides a system on chip. The system on chip comprises a memory cell. A peripheral circuit is configured to access the memory cell. A first power circuit is configured to generate a first driving voltage. A second power circuit is configured to generate a second driving voltage. A power controller is configured to generate a performance mode signal. An auto power switch is configured to be activated or deactivated in response to the performance mode signal. When deactivated, the auto power switch is configured to supply the first driving voltage and the second driving voltage to the memory cell and the peripheral circuit, respectively. When activated, the auto power switch is configured to supply the higher of the first driving voltage and the second driving voltage to the memory cell.

BRIEF DESCRIPTION OF THE DRAWINGS wherein more complete appreciation of the present disclosure and many of the attendant aspects thereof will be readily obtained as the same becomes better understood by reference to the following detailed description when considered in connection with the accompanying drawings, wherein:

FIG. 15 is a block diagram illustrating a handheld terminal according to an exemplary embodiment of the inventive concept.

DETAILED DESCRIPTION OF EMBODIMENTS

Hereinafter, exemplary embodiments of the inventive concept will be described in detail with reference to the accompanying drawings. The inventive concept, however, may be embodied in various different forms, and should not be construed as limited to the embodiments set forth herein. As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

Figure 1:
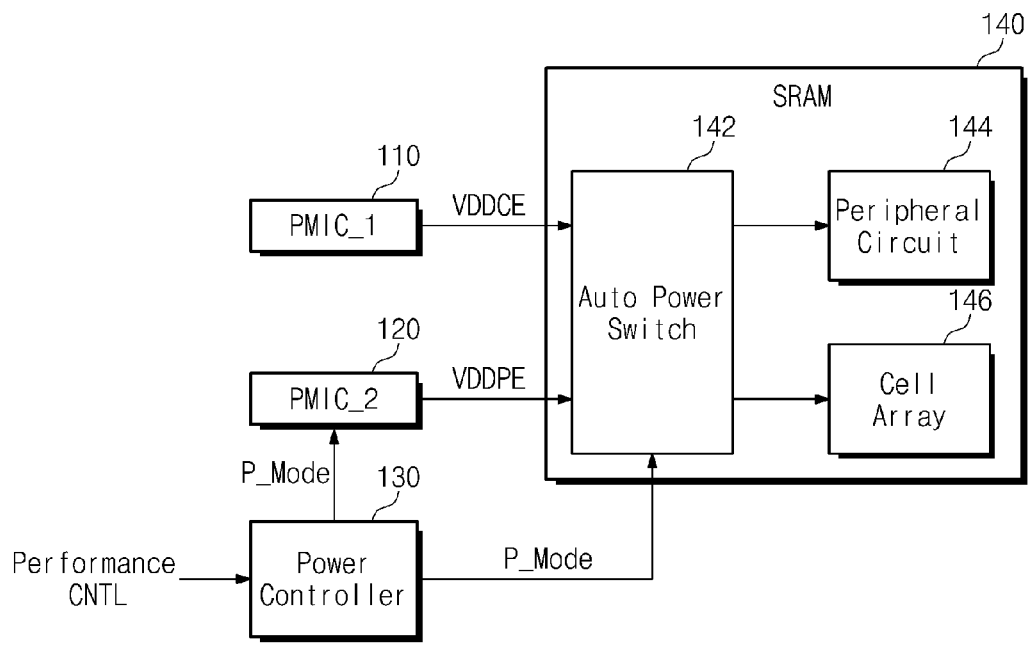
FIG. 1 is a block diagram illustrating a system on chip according to an exemplary embodiment of the inventive concept.

FIG. 1 is a block diagram illustrating a system on chip according to an exemplary embodiment of the inventive concept. Referring to FIG. 1, a system on chip 100 according to an exemplary embodiment of the inventive concept includes a first power circuit 110, a second power circuit 120, a power controller 130, and an SRAM 140. Here, the components 110, 120, 130, and 140 may be provided in intellectual property (IP) cores, respectively, of the system on chip 100, respectively.

The first power circuit 110 generates a cell driving voltage VDDCE. The cell driving voltage VDDCE is a voltage for driving memory cells of the SRAM 140. The first power circuit 110 generates the cell driving voltage VDDCE using an internal voltage of the system on chip 100 or using a voltage provided from an external device. When a voltage supplied from the external device is lower than the cell driving voltage VDDCE, the first power circuit 110 generates the cell driving voltage VDDCE using a boosting circuit, such as a charge pump circuit. When a voltage supplied from the external device is higher than the cell driving voltage VDDCE, the first power circuit 110 generates the cell driving voltage VDDCE using a down converting circuit.

The second power circuit 120 generates a peripheral driving voltage VDDPE. The peripheral driving voltage VDDPE is a voltage for driving control circuits except for the memory cells of the SRAM 140. The second power circuit 120 generates the peripheral driving voltage VDDPE that is variable according to a performance mode P_Mode. For example, the second power circuit 120 generates a relatively high peripheral driving voltage VDDPE when the performance mode P_Mode indicates a high-speed mode. The second power circuit 120 generates a relatively low peripheral driving voltage VDDPE when the performance mode P_Mode indicates a low-speed mode.

The power controller 130 generates the performance mode P_Mode in response to a performance control signal. The performance mode P_Mode is provided to the second power circuit 120 and the SRAM 140. When a high-speed operation of the system on chip 100 is required, high-speed data processing is requested through the performance control signal. Such request may be provided from an external device or may be generated in the system on chip 100. For example, high-speed data processing may be used when processing a video signal using the system on chip 100. Under this system circumstance, the performance control signal is provided for a high-speed operation. Low-speed data processing may be used when processing an audio signal using the system on chip 100. The power controller 130 generates the performance mode P_Mode according to the performance control signal. The performance control signal may be a control signal for Dynamic Voltage-Frequency Scaling (DVFS) of the system on chip 100.

The SRAM 140 provides a high-speed storage function to the system on chip 100. The SRAM 140 may be used as a cache memory, a register or a buffer memory of the system on chip 100. When speed is a critical factor of a system, relatively more weight may be given to the SRAM 140. An operating voltage may stay low, reducing power consumption of the system on chip 100 applied to a mobile device. A driving voltage of the SRAM 140 embedded in the system on chip 100 is decreased. However, a voltage decreased due to scale-down causes a decrease in the sensing margin of the SRAM 140. A power supply scheme may be used in which a level of the cell driving voltage VDDDE provided to memory cells of the SRAM 140 is maintained for a sufficient sensing margin and the peripheral driving voltage VDDPE provided to control circuits is decreased. A scheme in which power supply voltages are separately provided to the SRAM 140 is referred to as a dual power rail scheme. The SRAM 140 according to an exemplary embodiment of the inventive concept is supplied with a power in the dual power rail scheme.

The SRAM 140 secures a sensing margin and provides data integrity when a level of the cell driving voltage VDDCE is higher than a predetermined level. To reduce power consumption, the SRAM 140 uses the peripheral driving voltage VDDPE that is variable according to the performance mode P_Mode. However, when the performance mode P_Mode is a high-speed mode, the peripheral driving voltage VDDPE boosted may be rendered higher than the cell driving voltage VDDCE. An excessive increase in the peripheral driving voltage VDDPE may cause the cell driving voltage VDDCE to be relatively decreased, and thus, the sensing margin of memory cells that are driven by the cell driving voltage VDDCE may be reduced. The excessive increase in the peripheral driving voltage VDDPE may also cause a mismatch in signal delays between a peripheral circuit 144 and a cell array 146. To address such situation, a driving voltage provided to the cell array 146 is set to be substantially equal to or higher than a voltage provided to the peripheral circuit 144.

The SRAM 140 according to an exemplary embodiment of the inventive concept is configured to address a decrease in the sensing margin of memory cells and a mismatch in signal delays between the peripheral circuit 144 and the cell array 146 that may be caused by an excessive increase in the peripheral driving voltage VDDPE that is generated according to various factors. For example, although the peripheral driving voltage VDDPE is abnormally increased due to a characteristic variation caused by scale-down, a resistance difference of a dual power rail, or an external interference such as temperature or noise, the sensing margin of memory cells may be kept constant. The SRAM 140 according to an exemplary embodiment of the inventive concept includes an auto power switch 142, the peripheral circuit 144, and the cell array 146.

The auto power switch 142 is activated or inactivated according to the performance mode P_Mode. During an inactive state of the auto power switch 142, the cell driving voltage VDDCE provided from the first power circuit 110 is supplied to the cell array 146. During an inactive state of the auto power switch 142, the peripheral driving voltage VDDPE is provided from the second power circuit 120 to the peripheral circuit 144. However, in a high-performance or high-speed mode where a level of the peripheral driving voltage VDDPE is substantially equal to a level of the cell driving voltage VDDCE, the auto power switch 142 is activated. When the auto power circuit 142 is activated, the peripheral driving voltage VDDPE is compared with the cell driving voltage VDDCE. The auto power switch 142 supplies the higher of the peripheral driving voltage VDDPE and the cell driving voltage VDDCE according to a result of the comparison.

Under the control of the auto power switch 142, a voltage higher than a voltage supplied to the peripheral circuit 144 is provided to the cell array 146 of the SRAM 140. When a driving voltage of the peripheral circuit 144 is higher than a driving voltage of the cell array 146, the read margin of memory cells and the data integrity are decreased. The auto power switch 142 according to an exemplary embodiment of the inventive concept controls a driving voltage of the cell array 146 to be higher than or equal to a driving voltage of peripheral circuits. Thus, a system on chip may have high data integrity and speed characteristics.

Figure 2:
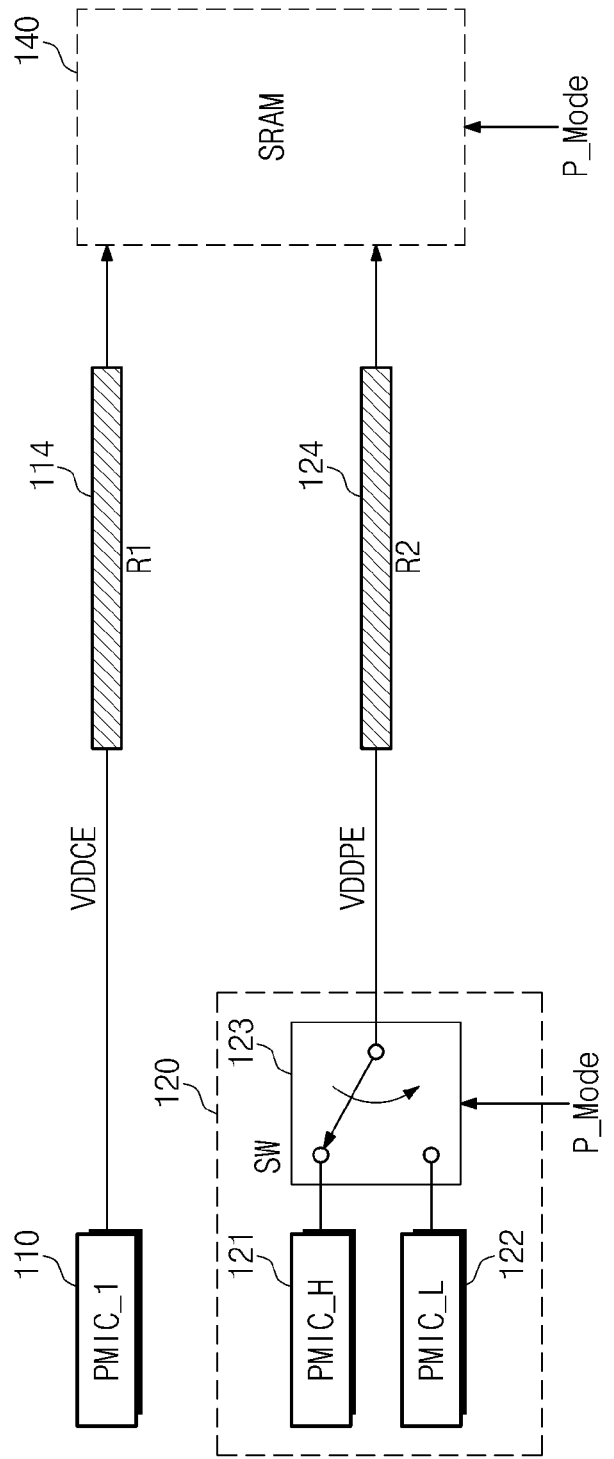
FIG. 2 is a block diagram illustrating a dual power rail illustrated in FIG. 1, according to an exemplary embodiment of the inventive concept.

FIG. 2 is a block diagram illustrating a dual power rail illustrated in FIG. 1, according to an exemplary embodiment of the inventive concept. Referring to FIG. 2, a dual power rail 114 and 124 is formed between power circuits 110 and 120 and an SRAM 140 and transmits a cell driving voltage VDDCE and a peripheral driving voltage VDDPE to the SRAM 140.

The power circuits 110 and 120 generate the driving voltages VDDCE and VDDPE that are provided to the SRAM 140. The first power circuit 110 generates the cell driving voltage VDDCE. The cell driving voltage VDDCE generated from the first power circuit 110 is transmitted to the SRAM 140 via the first power line 114. The first power circuit 110 generates the cell driving voltage VDDCE with a level that is constant regardless of a performance mode P_Mode. However, the first power circuit 110 may generate a voltage lower than a target voltage due to scale-down.

The second power circuit 120 generates the peripheral driving voltage VDDPE. The second power circuit 120 generates the peripheral driving voltage VDDPE with a level which is variable according to the performance mode P_Mode. The second power circuit 120 includes a high voltage generator 121 (denoted by 'PMIC_H' in FIG. 2) and a low voltage generator 122 (denoted by 'PMIC_L' in FIG. 2). The high voltage generator 121 generates a driving voltage that is to be provided to a peripheral circuit 144 at a high-speed mode. The low voltage generator 122 generates a driving voltage that is to be provided to the peripheral circuit 144 at a low-speed mode. A selection switch 123 selects an output of the high voltage generator 121 or an output of the low voltage generator 122 in response to the performance mode P_Mode. For example, when the performance mode P_Mode is a high-speed mode, the selection switch 123 selects an output of the high voltage generator 121 as the peripheral driving voltage VDDPE. When the performance mode P_Mode is a low-speed mode, the selection switch 123 selects an output of the low voltage generator 122 as the peripheral driving voltage VDDPE.

First and second power rails 114 and 124 form a dual power rail for providing a driving voltage to the SRAM 140. The first power rail 114 transfers a cell driving voltage VDDCE generated from the first power circuit 110 to the SRAM 140. The second power rail 124 transfers a peripheral driving voltage VDDPE generated from the second power circuit 120 to the SRAM 140.

The dual power rail 114 and 124 may include metal lines extending in parallel in a row or column direction. A metal line forming the first power line 114 may have a resistance value R1. A metal line forming the second power line 124 may have a resistance value R2. The resistance values R1 and R2 of the first and second power lines 114 and 124 may have substantially the same value. Alternatively, the resistance values R1 and R2 of the first and second power lines 114 and 124 may be set to be different from each other to optimize transfer characteristics of the cell driving voltage VDDCE and the peripheral driving voltage VDDPE. The resistance values R1 and R2 may be different from target values due to scale-down and process variations. Variations in the resistance values R1 and R2 may cause an irregular voltage drop.

The cell driving voltage VDDCE and the peripheral driving voltage VDDPE supplied to the SRAM 140 may be varied according to various factors. For example, an optimal power supply voltage might not be supplied to the SRAM 140 due to interference such as variations in outputs of the power circuits 110 and 120 caused by process variations, variations in resistance values R1 and R2 of the power lines 114 and 124, a variation in a driving condition, and noise.

Figure 3:
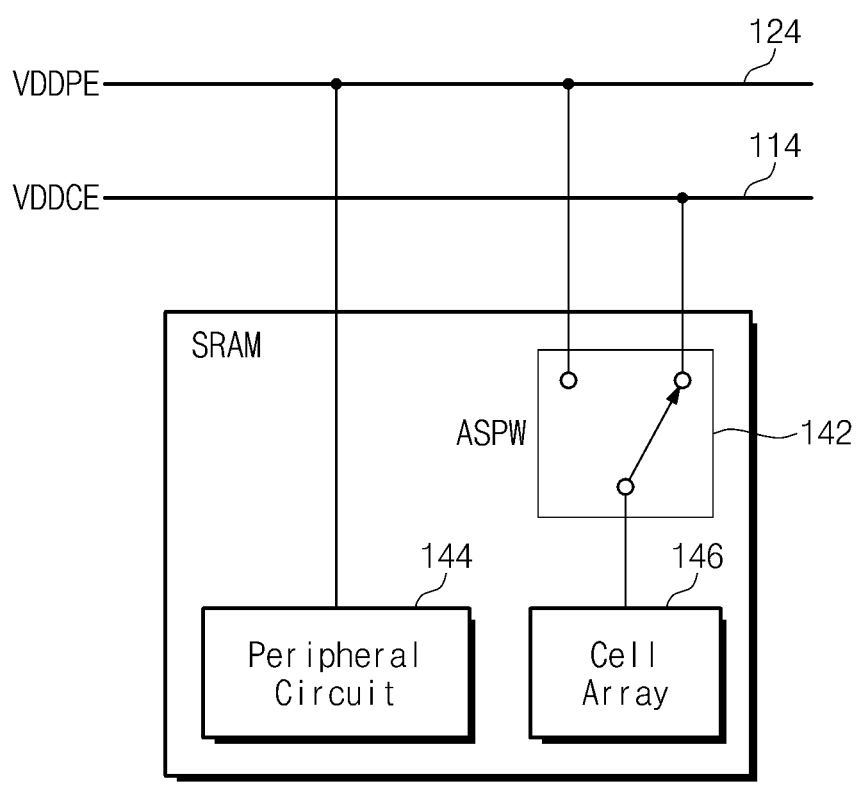
FIG. 3 is a block diagram illustrating an SRAM according to an exemplary embodiment of the inventive concept.

FIG. 3 is a block diagram illustrating an SRAM according to an exemplary embodiment of the inventive concept. Referring to FIG. 3, an SRAM 140 includes an auto power switch 142, a peripheral circuit 144, and a cell array 146. The auto power switch 142 selects the higher of a cell driving voltage VDDCE and a peripheral driving voltage VDDPE supplied to an SRAM 140 at a high-speed mode. The auto power switch 142 supplies the selected driving voltage to the cell array 146.

The cell driving voltage VDDCE and the peripheral driving voltage VDDPE supplied through power lines 114 and 124 have substantially the same or different levels from each other according to a performance mode P_Mode. For example, at a high-speed mode, the peripheral driving voltage VDDPE is supplied, thus allowing a peripheral circuit 144 to be driven at a high speed. At the high-speed mode, a level of the peripheral driving voltage VDDPE is exemplary equal to a level of the cell driving voltage VDDCE. However, when the peripheral driving voltage VDDPE is rendered higher than the cell driving voltage VDDCE provided to the SRAM 140 by a process error or various interferences, the read margin of memory cells may be sharply reduced.

The peripheral driving voltage VDDPE may be prevented from being rendered higher than the cell driving voltage VDDCE by a function of the auto power switch 142. In the high-speed mode, the auto power switch 142 is configured to supply the higher of the peripheral driving voltage VDDPE and the cell driving voltage VDDCE to the cell array 146. Thus, a driving voltage of the peripheral circuit 144 may be prevented from being rendered higher than a driving voltage of the cell array 146. In a low-speed mode, the auto power switch 142 is configured to supply the cell driving voltage VDDCE to the cell array 146.

Figure 4:
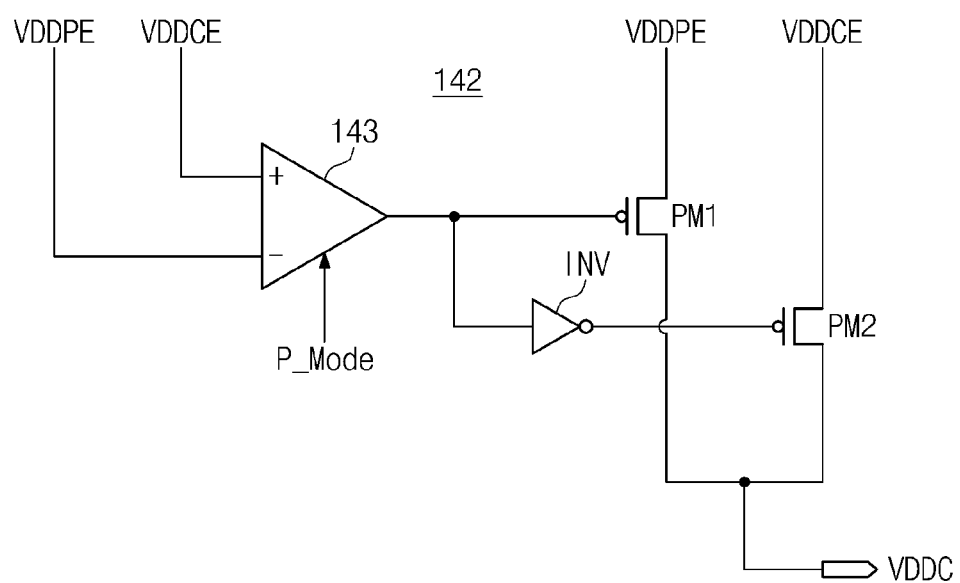
FIG. 4 is a circuit diagram illustrating an auto power switch illustrated in FIG. 3, according to an exemplary embodiment of the inventive concept.

FIG. 4 is a circuit diagram illustrating an auto power switch illustrated in FIG. 3, according to an exemplary embodiment of the inventive concept. Referring to FIG. 4, an auto power switch 142 includes a comparator 143, an inverter INV, and first and second PMOS transistors PM1 and PM2.

The comparator 143 compares a peripheral driving voltage VDDPE with a cell driving voltage VDDCE. The comparator 143 is activated or inactivated according to a performance mode P_Mode. For example, the comparator 143 is activated in a high-speed mode where a level of the peripheral driving voltage VDDPE increases. When activated, the comparator 143 compares the peripheral driving voltage VDDPE with the cell driving voltage VDDCE. When the peripheral driving voltage VDDPE is higher than the cell driving voltage VDDCE, the comparator 143 outputs a low level signal. The first PMOS transistor PM1 is turned on, and the second PMOS transistor is turned off. Thus, the peripheral driving voltage VDDPE, which is relatively higher than the cell driving voltage, is provided as a cell voltage VDDC. When the peripheral driving voltage VDDPE is equal to or lower than the cell driving voltage VDDCE, the comparator 143 outputs a high level signal. The first PMOS transistor PM1 is turned off, and the second PMOS transistor is turned on. Thus, the cell driving voltage VDDCE, which is relatively higher than the peripheral driving voltage VDDPE, is provided as the cell voltage VDDC.

When the performance mode P_Mode corresponds to a low speed, an output of the comparator 143 is fixed to a high level. In this case, the cell driving voltage VDDCE is provided as the cell voltage VDDC for driving a cell array 146.

According to an exemplary embodiment of the inventive concept, the auto power switch 142 selects the higher of voltages VDDPE and VDDCE supplied through a dual power rail according to a performance mode. Alternatively, the performance mode P_Mode may be switched according to frequencies or the speed of a system on chip 100.

Figure 5:
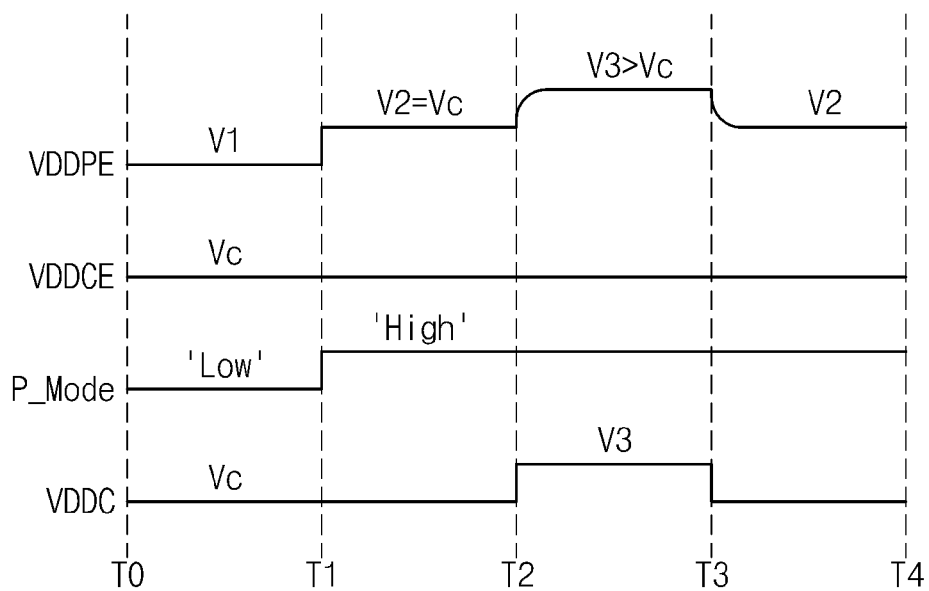
FIG. 5 is a waveform diagram illustrating input and output voltages of an auto power switch according to an exemplary embodiment of the inventive concept.

FIG. 5 is a waveform diagram illustrating input and output voltages of an auto power switch according to an exemplary embodiment of the inventive concept. Referring to FIG. 5, an auto power switch 142 compares a cell driving voltage VDDCE with a peripheral driving voltage VDDPE according to a performance mode P_Mode. A cell voltage VDDC that is to be supplied to a cell array 146 is selected according to the comparison result.

For purposes of description, the performance mode P_Mode corresponds to a low-speed mode between T0 and T1. For example, for purposes of description, the performance mode P_Mode has a logically low level corresponding to the low-speed mode. An output of a comparator 143 is fixed to a high level. In this case, the peripheral driving voltage VDDPE and the cell driving voltage VDDCE are supplied to a peripheral circuit 144 and a cell array 146, respectively, regardless of levels. The peripheral driving voltage VDDPE may be lower than the cell driving voltage VDDCE. A cell voltage VDDC supplied to the cell array 146 may have a relatively high level Vc.

At T1, the performance mode P_Mode transitions to a logically high level corresponding to a high-speed mode. In this case, a second power circuit 120 increases the peripheral driving voltage VDDPE to a voltage Vc. A level of the peripheral driving voltage VDDPE increased is equal to a level of the cell driving voltage VDDCE. Thus, although the comparator 143 is activated, the cell driving voltage VDDCE is supplied to the cell array 146.

At T2, a level of the peripheral driving voltage VDDPE rises to a level V3 due to a process characteristic or interference. The comparator 143 outputs a low level signal indicating that the peripheral driving voltage VDDPE is higher than the cell driving voltage VDDCE. A first PMOS transistor P1 is turned on by the low level signal from the comparator 143, and thus, the peripheral driving voltage VDDPE having a level V3 is supplied to the cell array 146 as the cell voltage VDDC.

At T3, the peripheral driving voltage VDDPE decreases to the level V2, and a second PMOS transistor PM2 is turned on by an output of the comparator 143. Thus, the cell driving voltage VDDCE having the level Vc is selected as the cell voltage VDDC.

A method of supplying the cell voltage VDDC to the cell array 146 according to the performance mode P_Mode and according to a difference between the peripheral driving voltage VDDPE and the cell driving voltage VDDCE is described. Although the peripheral driving voltage VDDPE becomes higher than the cell driving voltage VDDCE, the relatively higher of the peripheral driving voltage VDDPE and the cell driving voltage VDDCE is supplied to the cell array 146 (or, memory cells of the cell array 146) through the auto power switch 142 according to an exemplary embodiment of the inventive concept. Thus, the cell voltage VDDC supplied to the cell array 146 is higher than or equal to a voltage supplied to the peripheral circuit 144.

Figure 6:
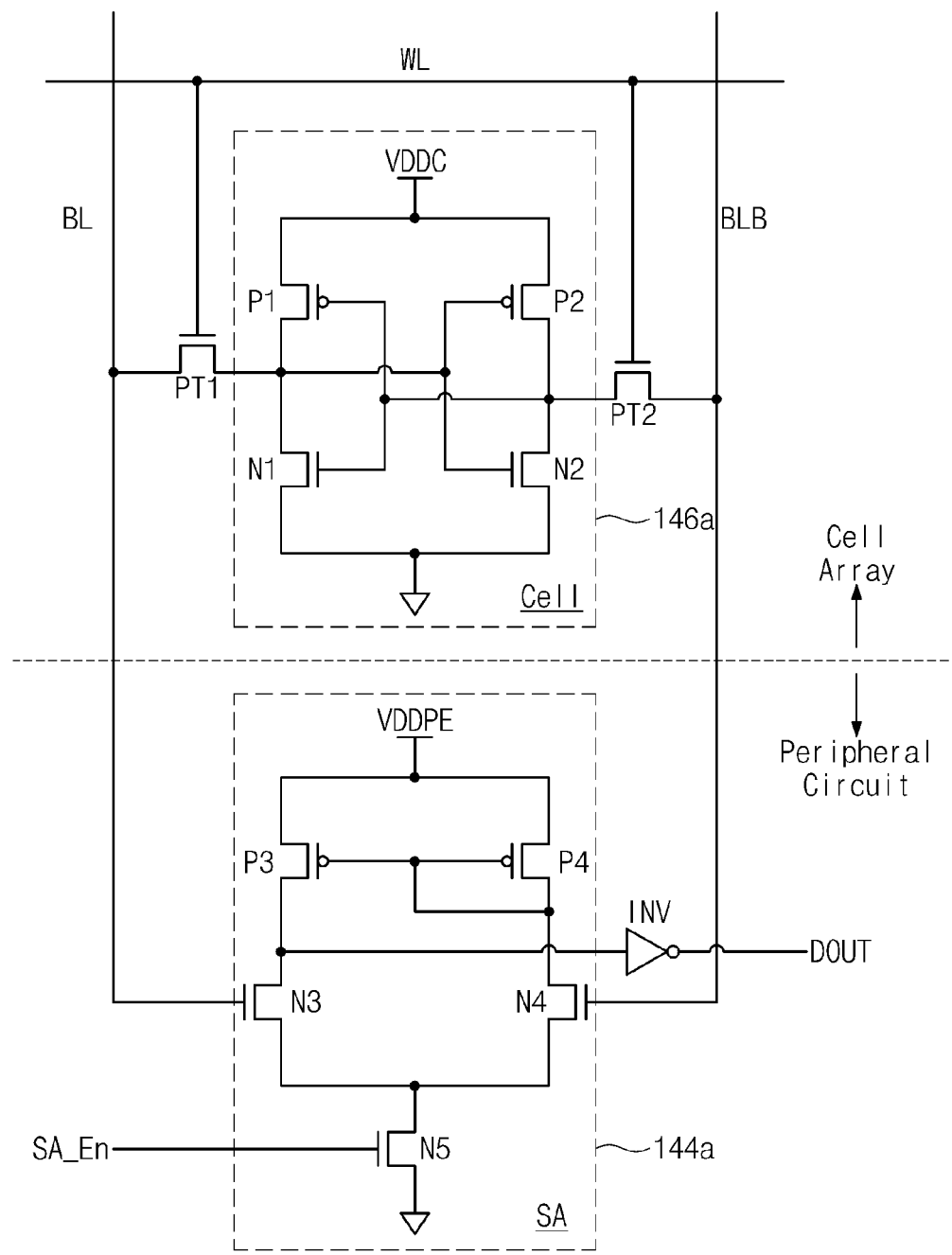
FIG. 6 is a circuit diagram illustrating a cell array and a peripheral circuit according to an exemplary embodiment of the inventive concept.

FIG. 6 is a circuit diagram illustrating a cell array and a peripheral circuit according to an exemplary embodiment of the inventive concept. Referring to FIG. 6, an SRAM 140 according to an exemplary embodiment of the inventive concept includes a sense amplifier 144a and a memory cell 146a. The sense amplifier 144a may correspond to a part of a peripheral circuit 144, and the memory cell 146a may correspond to a part of a cell array 146.

For example, the memory cell 146a uses a 1-port SRAM cell including four transistors. The memory cell 146a includes a first inverter including a PMOS transistor P1 and an NMOS transistor N1. The memory cell 146a further comprises a second inverter including a PMOS transistor P2 and an NMOS transistor N2. An output terminal of the first inverter is connected to an input terminal of the second inverter, and an output terminal of the second inverter is connected to an input terminal of the first inverter. The memory cell 146a is connected to a word line WL and bit lines BL and BLB through path transistors PT1 and PT2. Gates of the path transistors PT1 and PT2 are connected to the word line WL. When a selection voltage is applied to the word line WL, the path transistors PT1 and PT2 are turned on, allowing the memory cell 146a including the first and second inverters to be connected a bit line pair BL and BLB.

The memory cell 146a uses a cell voltage VDDC from an auto power switch 142 as a cell power. For example, a voltage selected by the auto power switch 142 is supplied to source terminals of the PMOS transistors P1 and P2. In a low-speed mode, the memory cell 146a is supplied with a cell driving voltage VDDCE that is relatively higher than a peripheral driving voltage VDDPE. In a high-speed mode, the memory cell 146a is supplied with the higher of the peripheral driving voltage VDDPE and the cell driving voltage VDDCE.

The sense amplifier 144a senses data stored in the memory cell 146a by detecting a voltage variation in the bit line pair BL and BLB. The sense amplifier 144a includes PMOS transistors P3 and P4 and NMOS transistors N3 and N4. An inverter INV forming an output unit of the sense amplifier 144a may be connected to a drain terminal of the PMOS transistor P3 and a drain terminal of the NMOS transistor N3. Gates of the PMOS transistors P3 and P4 are connected in common to a drain terminal of the PMOS transistor P3 and a drain terminal of the NMOS transistor N3. Sources of the NMOS transistors N3 and N4 are selectively grounded through a selection transistor N5 for activating the sense amplifier 144a. When a sense amplifier enable signal SA_En is activated, the sources of the NMOS transistors N3 and N4 are grounded. Accordingly, the sense amplifier 144a operates.

The sense amplifier 144a uses a peripheral driving voltage VDDPE as a power source. For example, the peripheral driving voltage VDDPE is supplied in common to the sources of the PMOS transistors P3 and P4. The peripheral driving voltage VDDPE is variable by a second power circuit 120 (refer to FIG. 2) according to a performance mode P_Mode. A sensing speed of the sense amplifier 144a is increased by increasing the peripheral driving voltage VDDPE in a high-speed mode. A sensing speed of the sense amplifier 144a is relatively low since the peripheral driving voltage VDDPE is relatively low in a low-speed mode. Thus, a voltage variation in the bit line pairs BL and BLB might not be quickly sensed in the low-speed mode.

The cell voltage VDDC is set to be equal to or higher than a voltage supplied to the peripheral circuit 144 by an auto power switch 142. Thus, the sensing margin may be prevented from being reduced when the peripheral driving voltage VDDPE is rendered relatively high by a structure of the SRAM 140 according to an exemplary embodiment of the inventive concept.

Figure 7:
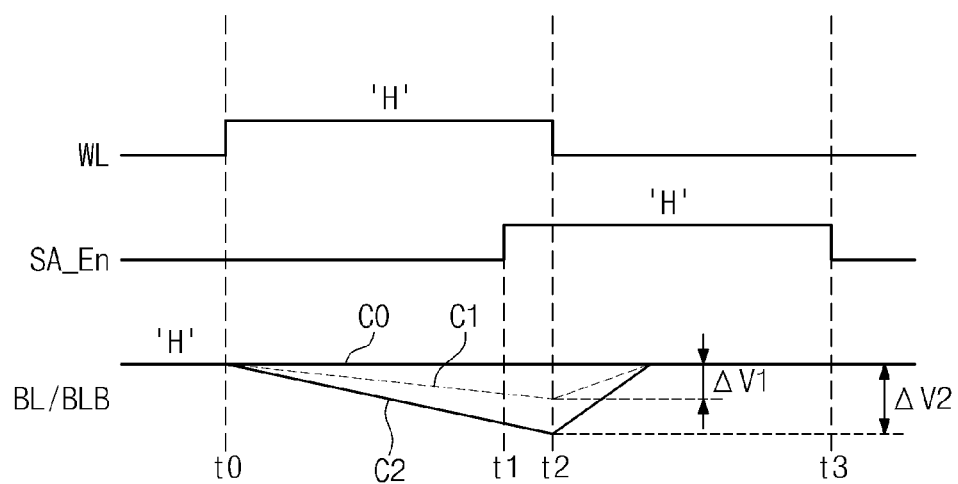
FIG. 7 is a timing diagram illustrating a sensing operation of an SRAM illustrated in FIG. 6, according to an exemplary embodiment of the inventive concept.

FIG. 7 is a timing diagram illustrating a sensing operation of an SRAM illustrated in FIG. 6, according to an exemplary embodiment of the inventive concept. Referring to FIG. 7, although a peripheral driving voltage VDDPE is higher than a cell driving voltage VDDCE, during a sensing operation, a voltage difference between bit lines BL and BLB may be kept higher than a predetermined level.

At t0, a word line WL transitions to a high level during a read operation, and thus, path transistors PT1 and PT2 are turned on. Data stored in a memory cell is transferred to the bit lines BL and BLB through the path transistors PT1 and PT2. For purposes of description, the bit lines BL and BLB are pre-charged and equalized, and a logical value transferred to the bit line BL is logically 'High' and a logical value transferred to the bit line BLB is logically 'Low'. Under this circumstance, a voltage of the bit line BL is hardly varied. A curve 'C0' shows a voltage variation in the bit line BL.

However, a voltage applied to the bit line BLB decreases because charges pre-charged to the bit line BLB is discharged through a pull-down path of a memory cell. A voltage applied to the bit line BLB may decreases through the discharging operation. A curve C2 shows a voltage variation in the bit line BLB.

At t1, a sense amplifier enable signal SA_En is activated to a high level H. A selection transistor N5 is turned on by the sense amplifier enable signal SA_En, and a ground path of a sense amplifier 144a is formed. For example, a sensing operation starts. The sensing operation of the sense amplifier 144a is accomplished by detecting a voltage difference between the bit lines BL and BLB. When the voltage difference between the bit lines BL and BLB is insufficient, a sensing speed is significantly decreased. When the voltage difference between the bit lines BL and BLB is insufficient, the sense amplifier 144a slowly transits to a bi-stable state. When the voltage difference between the bit lines BL and BLB is sufficient, the sensing operation of the sense amplifier 144a is quickly performed. Thus, a sensing execution period of the sense amplifier 144a may be reduced, increasing the operating speed of the sense amplifier 144a.

At t2, the word line WL transitions to a low level. The path transistors PT1 and PT2 are turned off, and the bit lines BL and BLB are pre-charged with a high level.

At t3, as the sense amplifier enable signal SA_En transitions to a low level, the sense amplifier 144a is inactivated.

Below, a voltage variation in a bit line pair BL and BLB at an activate state of the word line WL is described. As a voltage variation in the bit line BLB corresponding to a logically low level is accelerated, the sensing margin increases. Referring to the curve C2 showing a voltage variation in the bit line BLB, a maximum voltage difference between the bit lines BL and BLB at t2 when the word line WL is activated is ΔV1. The curve C1 shows when a cell voltage VDDC is lower than a peripheral driving voltage VDDPE. Referring to the curve C1, error data may be output since the sufficient sensing margin is not secured. Referring to the curve C2 showing a voltage variation in the bit line BLB when the cell voltage VDDC is higher than the peripheral driving voltage VDDPE, a maximum voltage difference between the bit lines BL and BLB at t2 when the word line WL is activated is ΔV2. The sufficient voltage difference may be obtained since a gate voltage of the NMOS transistor N2 for controlling a pull-down operation of the memory cell 146a is relatively high.

The auto power switch 142 according to an exemplary embodiment of the inventive concept is configured to allow the cell voltage VDDC higher than the peripheral driving voltage VDDPE to be supplied to the memory cell 146a. The sense amplifier 144a may be provided with the sufficient sensing margin even at a high-speed mode in which the peripheral driving voltage VDDPE increases. By the cell power supplying method according to an exemplary embodiment of the inventive concept, a sufficiently fast voltage variation in the bit line pair BL and BLB is provided even though a sensing speed of the sense amplifier 144a increases in the high-speed mode.

Figure 8:
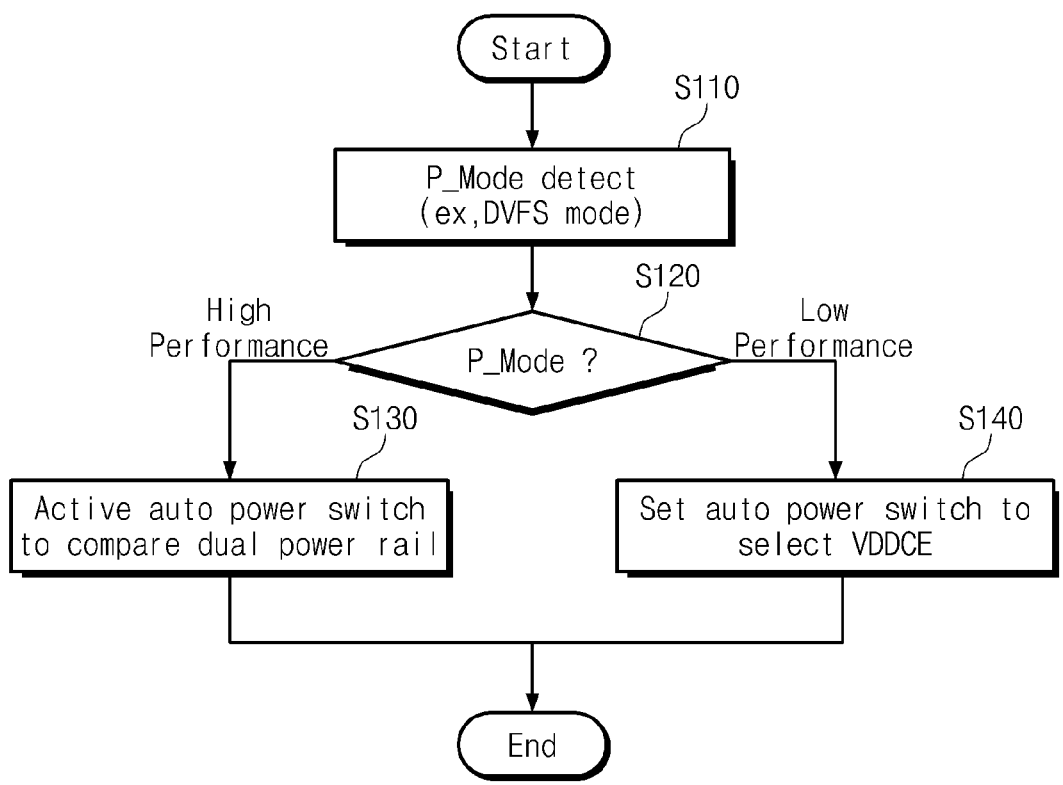
FIG. 8 is a flow chart illustrating an auto power switching method of an SRAM according to an exemplary embodiment of the inventive concept.

FIG. 8 is a flow chart illustrating an auto power switching method of an SRAM according to an exemplary embodiment of the inventive concept. A power selecting method of an auto power switch 142 is described in greater detail with reference to FIGS. 4 to 8.

In step S110, a performance mode P_Mode of a system on chip 100 is detected. A level of a peripheral driving voltage VDDPE is varied according to a performance mode P_Mode. An exemplary embodiment where a level of the peripheral driving voltage VDDPE is varied according to a variation in the performance mode P_Mode is described. However, the inventive concept is not limited thereto. For example, a voltage setting mode of the system on chip 100 using Dynamic Voltage-Frequency Scaling (DVFS) may be replaced with the performance mode P_Mode.

In step S120, an operating divergence may arise according to the performance mode P_Mode. When the performance mode P_Mode corresponds to a high-speed mode, the method proceeds to step S130. When the performance mode P_Mode corresponds to a low-speed mode, the method proceeds to step S140.

In step S130, a peripheral driving voltage VDDPE and a cell driving voltage VDDCE provided through a dual power rail of an auto power switch 142 are compared. When activated, a comparator 143 selects the higher of the peripheral driving voltage VDDPE and the cell driving voltage VDDCE. The selected driving voltage is provided as a cell voltage VDDC of a cell array 144.

In step S140, the comparator 143 is inactivated. That is, the peripheral driving voltage VDDPE and the cell driving voltage VDDCE are not compared. At this time, the auto power switch 142 transfers the cell driving voltage that is fixed as the cell voltage VDDC.

A method of activating the auto power switch 142 is described. The auto power switch 142 is configured to compare the peripheral driving voltage VDDPE with the cell driving voltage VDDCE according to the performance mode P_Mode of the system on chip 100. The peripheral driving voltage VDDPE and the cell driving voltage VDDCE may vary due to a process variation, external interference, a temperature, etc. in a high-speed mode. However, when the auto power switch 142 is activated, the higher of the peripheral driving voltage VDDPE and the cell driving voltage VDDCE is selected as the cell voltage VDDC. By the auto power switching method according to an exemplary embodiment of the inventive concept, the sensing margin of an SRAM 140 may be kept large, and high data integrity may be provided even in a high speed.

Figure 9:
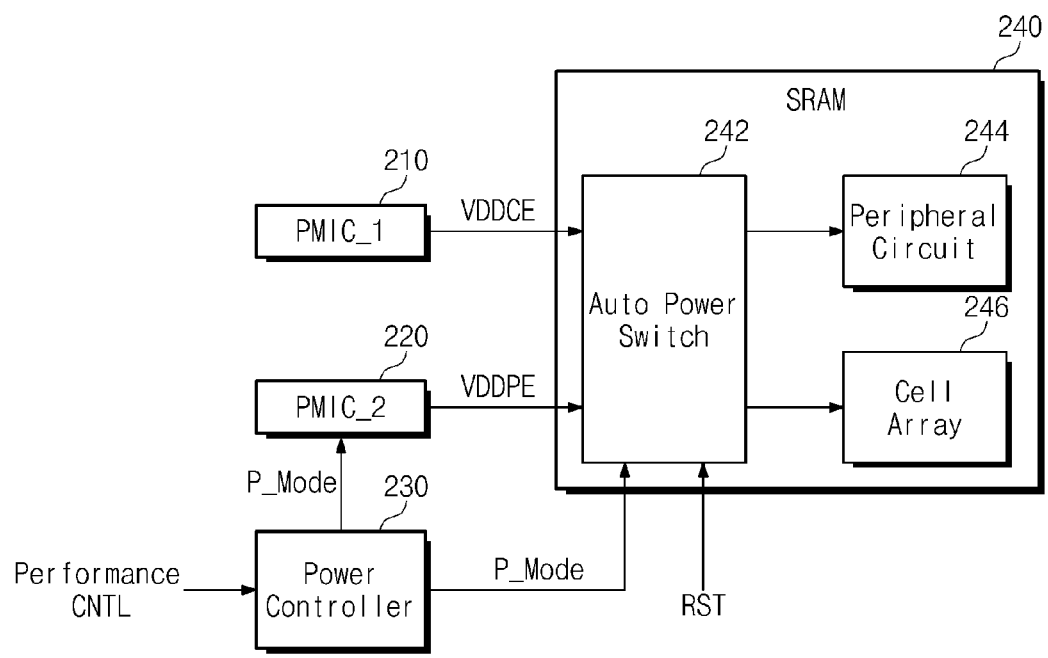
FIG. 9 is a block diagram illustrating a system on chip according to an exemplary embodiment of the inventive concept.

FIG. 9 is a block diagram illustrating a system on chip according to an exemplary embodiment of the inventive concept. Referring to FIG. 9, a system on chip 200 includes a first power circuit 210, a second power circuit 220, a power controller 230, and an SRAM 240.

The first power circuit 210, the second power circuit 220, and the power controller 230 are substantially the same as the first power circuit 110, the second power circuit 120, and the power controller 130, respectively, as illustrated in FIG. 1.

The SRAM 240 is high-speed storage of the system on chip 200. For example, the SRAM 240 may be a cache memory, a register, or a buffer memory of the system on chip 200. To implement low-power and high-performance characteristics, the SRAM 240 may be configured to receive a driving voltage VDDPE of a peripheral circuit 244 and a driving voltage VDDCE of a cell array 246 through distinct power lines (or, a dual power rail). For example, a data input/output operation of the SRAM 240 is performed using the driving voltages VDDPE and VDDCE provided through a dual power rail.

As a control signal, a reset signal RST is provided to the SRAM 240. An auto power switch 242 may refer to the reset signal RST for a control operation. At booting or resetting, the auto power switch 242 may set a power of the SRAM 240 based on the reset signal RST. For example, at boosting, the auto power switch 242 sets a cell voltage of the cell array 246 referring to the reset signal RST, not a performance mode P_Mode. For example, at the beginning, the SRAM 240 sets the cell voltage VDDC to the cell driving voltage VDDCE in response to the reset signal RST. After a cell voltage is selected by the reset signal RST, the SRAM 240 selects the cell driving voltage VDDCE or the peripheral driving voltage VDDPE referring to the performance mode P_Mode.

Figure 10:
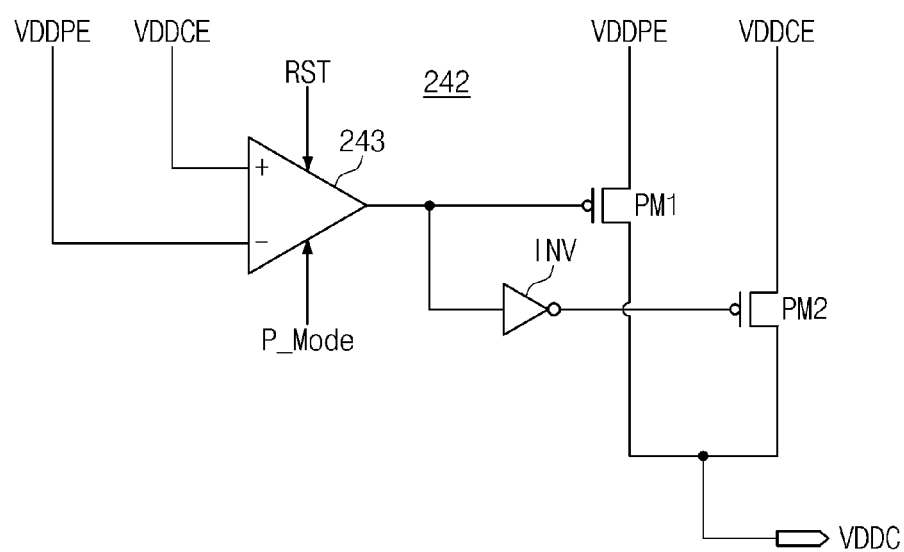
FIG. 10 is a circuit diagram illustrating an auto power switch illustrated in FIG. 9, according to an exemplary embodiment of the inventive concept.

FIG. 10 is a circuit diagram illustrating an auto power switch illustrated in FIG. 9, according to an exemplary embodiment of the inventive concept. An auto power switch 242 includes a comparator 243, an inverter INV, and PMOS transistors PM1 and PM2. The components INV, PM1, and PM2 are substantially the same as the components INV, PM1, and PM2, respectively, as illustrated in FIG. 4.

The comparator 243 compares a peripheral driving voltage VDDPE with a cell driving voltage VDDCE. The comparator 243 is reset by a reset signal RST. In response to the reset signal RST, the comparator 243 provides the cell driving voltage VDDCE to a cell array 246 regardless of levels of the peripheral driving voltage VDDPE. For example, the comparator 243 outputs a high level in response to the reset signal RST. A high level output of the comparator 243 is maintained from when the reset signal RST is applied until when a performance mode P_Mode is provided.

The auto power switch 242 automatically switches between the first power circuit 210 and the second power circuit 220 without an abnormal operation even when power is applied to the system on chip 200 or even when power supply is resumed by a reset operation. The reset signal RST may be replaced with a chip selection signal /CS or a clock signal CLK provided to the system on chip 200. Alternatively, the reset signal RST is generated by decoding various control signals.

Figure 11:
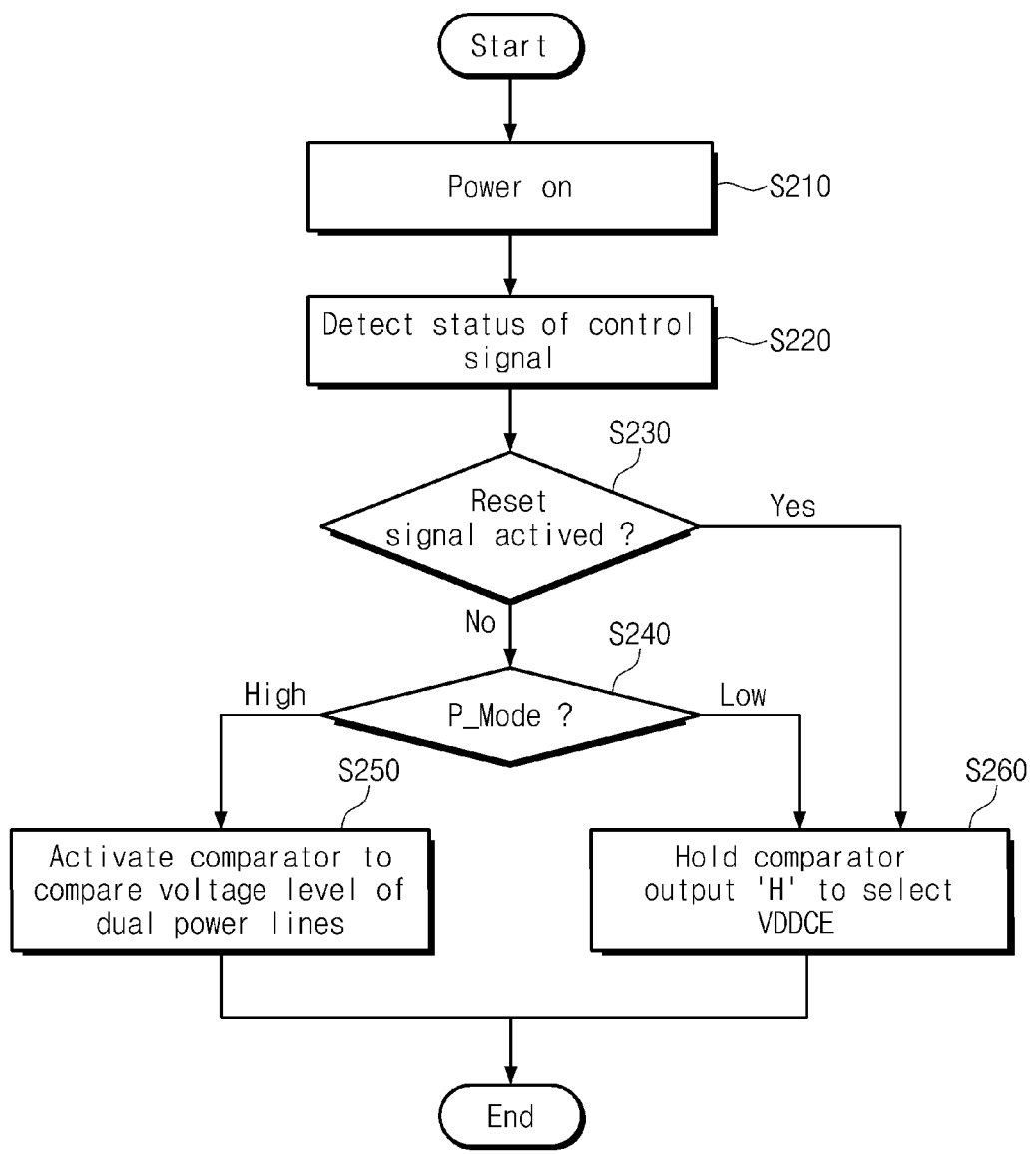
FIG. 11 is a flow chart illustrating a power-on operation of an auto power switch illustrated in FIG. 9, according to an exemplary embodiment of the inventive concept.

FIG. 11 is a flow chart illustrating a power-on operation of an auto power switch illustrated in FIG. 9, according to an exemplary embodiment of the inventive concept. Referring to FIG. 9, an auto power switch 242 supplies a cell driving voltage VDDCE to a cell array 246 at power-on of a system on chip 200.

In step S210, power is supplied to the system on chip 200. The system on chip 200 performs a power-on operation. For example, when a level of a power supply voltage is higher than a predetermined level, a reset operation of the system on chip 200 is performed.

In step S220, the system on chip 200 detects a state of a control signal. For example, the system on chip 200 detects a state of a control signal, such as a chip selection signal /CS, a clock signal CLK, or a reset signal RST.

In step S230, an operating divergence may arise according to a state of the reset signal RST. When a reset operation of the system on chip is completed and the reset signal RST is inactivated, the method proceeds to step S240. When the reset signal RST is activated, the method proceeds to step S260.

In step S240, a performance mode P_Mode is detected after the reset operation of the system on chip 200 is completed. When the performance mode P_Mode corresponds to a high-speed mode, the method proceeds to step S250. When the performance mode P_Mode corresponds to a low-speed mode, the method proceeds to step S260.

In step S250, an auto power switch 242 is activated to compare a peripheral driving voltage VDDPE with a cell driving voltage VDDCE. When activated, a comparator 243 selects the higher of the peripheral driving voltage VDDPE and the cell driving voltage VDDCE and supplies the selected driving voltage as a cell voltage VDDC.

In step S260, the auto power switch 242 is inactivated, and thus, the cell driving voltage VDDCE that is fixed to a predetermined level is supplied as the cell voltage VDDC.

The auto power switch 242 compares the peripheral driving voltage VDDPE with the cell driving voltage VDDCE according to a control signal (e.g., a reset signal RST) and a performance mode P_Mode of the system on chip 200. The peripheral driving voltage VDDPE and the cell driving voltage VDDCE may vary due to a process variation, external interference, a temperature, etc. in a high-speed mode. However, when activated, the auto power switch 242 selects the higher of the peripheral driving voltage VDDPE and the cell driving voltage VDDCE. By the auto power switching method according to an exemplary embodiment of the inventive concept, the sensing margin of an SRAM 240 may be kept large, and high data integrity may be provided even in a high speed.

Figure 12:
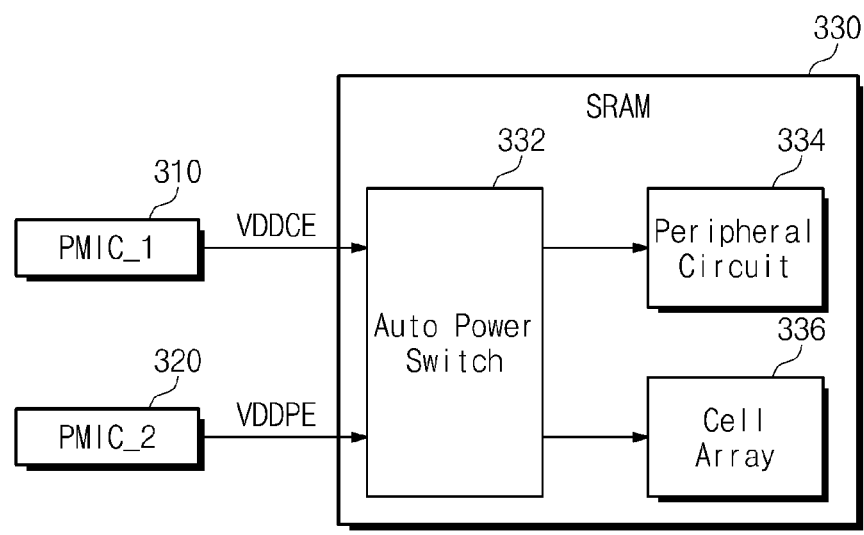
FIG. 12 is a block diagram illustrating a system on chip according to an exemplary embodiment of the inventive concept.

FIG. 12 is a block diagram illustrating a system on chip according to an exemplary embodiment of the inventive concept. Referring to FIG. 12, a system on chip 300 includes a first power circuit 310, a second power circuit 320, and an SRAM 330.

The first power circuit 310 and the second power circuit 320 are substantially the same as the first power circuit 110 and the second power circuit 120, respectively, as illustrated in FIG. 1.

The SRAM 330 includes an auto power switch 332 that compares a cell driving voltage VDDCE with a peripheral driving voltage VDDPE regardless of a performance mode P_Mode to select a cell voltage VDDC. The auto power switch 332 compares the cell driving voltage VDDCE with the peripheral driving voltage VDDPE supplied from the first power circuit 310 and the second power circuit 320 through a dual power rail. The auto power switch 332 selects a higher driving voltage according to the comparison result and transfers the selected voltage to a cell array 336. In a low-speed mode, the peripheral driving voltage VDDPE is lower in level than the cell driving voltage VDDCE. Thus, in the low-speed mode, the cell driving voltage VDDCE generated by the first power circuit 310 is supplied to the cell array 336. The peripheral driving voltage VDDPE may be higher in level than the cell driving voltage VDDCE in a high-speed mode. In this case, the peripheral driving voltage VDDPE is supplied to the cell array 336.

Figure 13:
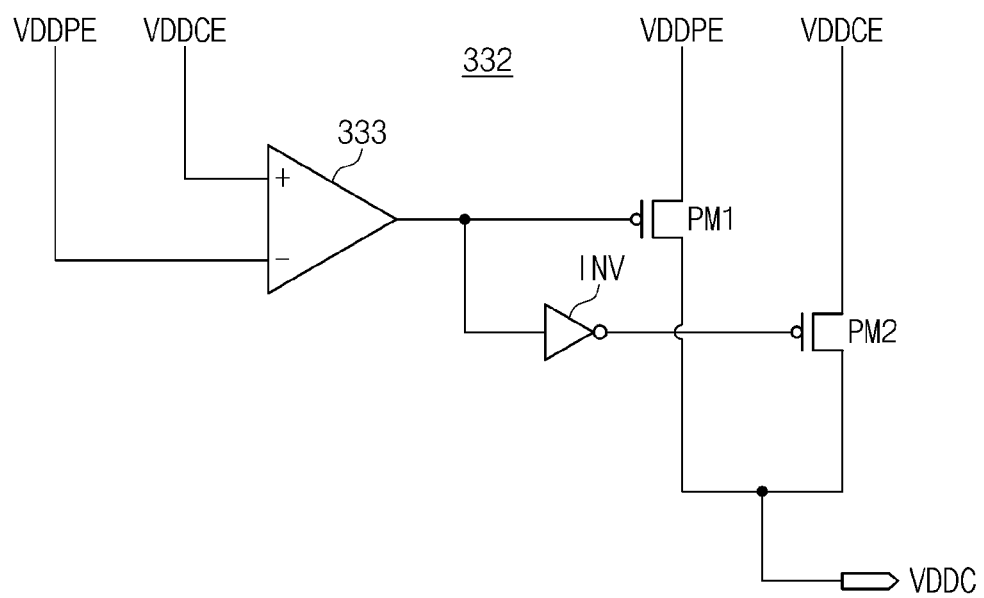
FIG. 13 is a circuit diagram illustrating an auto power switch illustrated in FIG. 12, according to an exemplary embodiment of the inventive concept.

FIG. 13 is a circuit diagram illustrating an auto power switch illustrated in FIG. 12, according to an exemplary embodiment of the inventive concept. An auto power switch 332 includes a comparator 333, an inverter INV, and PMOS transistors PM1 and PM2. The components INV, PM1, and PM2 are substantially the same as the components INV, PM1, and PM2, respectively, as illustrated in FIG. 4.

The comparator 333 compares a peripheral driving voltage VDDPE with a cell driving voltage VDDCE. The comparator 333 controls the PMOS transistors PM1 and PM2 to select the higher of the peripheral driving voltage VDDPE and the cell driving voltage VDDCE. Unlike the auto power switches 143 and 243 described above in connection with FIGS. 4 and 10, the comparator 333 compares the peripheral driving voltage VDDPE with the cell driving voltage VDDCE, and thus, the peripheral driving voltage VDDPE may be lower than the cell driving voltage VDDCE in a low-speed mode.

Regardless of an operating mode or a power state of the system on chip 300, the auto power switch 333 selects the higher of the peripheral driving voltage VDDPE and the cell driving voltage VDDCE and supplies the selected driving voltage to a cell array 336.

Figure 14:
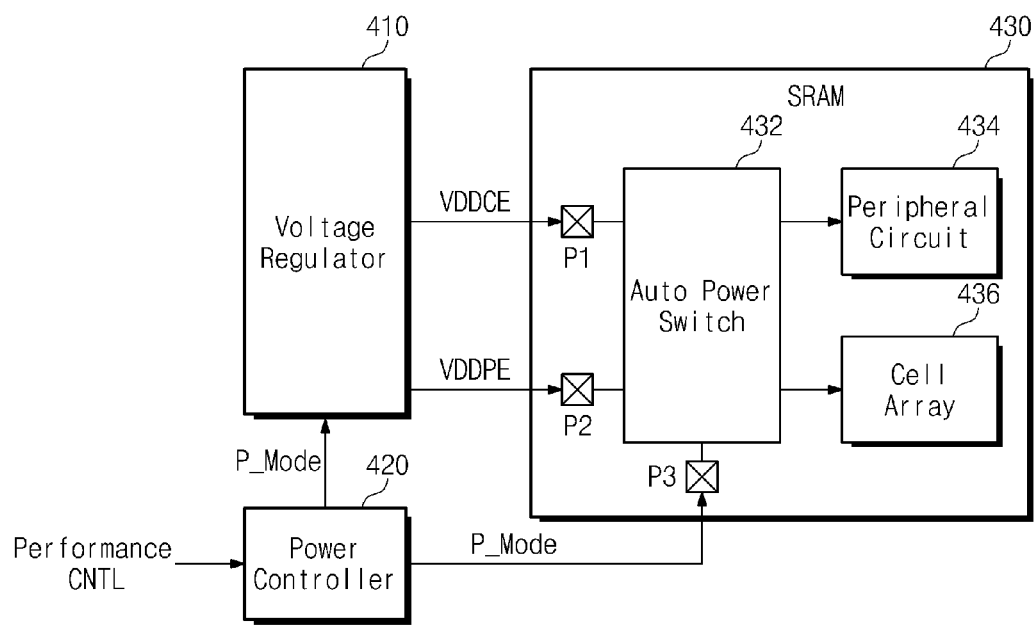
FIG. 14 is a block diagram illustrating an electronic device according to an exemplary embodiment of the inventive concept.

FIG. 14 is a block diagram illustrating an electronic device according to an exemplary embodiment of the inventive concept. Referring to FIG. 14, an electronic device 400 is implemented by mounting a plurality of semiconductor devices on a printed circuit board, not a system on chip. An SRAM 430 includes a chip mounted on the printed circuit board. The electronic device 400 includes a voltage regulator 410, a power controller 420, and the SRAM 430.

The voltage regulator 410 supplies a cell driving voltage VDDCE and a peripheral driving voltage VDDPE to the SRAM 430 through a dual power rail. The voltage regulator 410 adjusts a level of the peripheral driving voltage VDDPE according to a performance mode P_Mode. The voltage regulator 410 includes a semiconductor chip.

The power controller 420 changes a driving voltage or a frequency of the electronic device 400 according to the performance mode P_Mode. For example, the power controller 420 increases a driving voltage or a frequency of the electronic device 400 in a high-speed mode. The power controller 420 provides the performance mode P_Mode to the voltage regulator 410 and the SRAM 430.

The SRAM 430 includes an auto power switch 432, a peripheral circuit 434, and a cell array 436. The SRAM 430 receives the cell driving voltage VDDCE and the peripheral driving voltage VDDPE through power pads P1 and P2 connected to the dual power rail. The SRAM 430 receives the performance mode P_Mode through a pad P3 receiving a control signal.

The auto power switch 432 selectively compares the cell driving voltage VDDCE with the peripheral driving voltage VDDPE received through the pads P1 and P2 according to the performance mode P_Mode. Based on the comparison result, the auto power switch 432 selects the higher of the cell driving voltage VDDCE and the peripheral driving voltage VDDPE as a voltage that is supplied to a cell array 436.

FIG. 15 is a block diagram illustrating a handheld terminal according to an exemplary embodiment of the inventive concept. Referring to FIG. 15, a handheld terminal 1000 according to an exemplary embodiment of the inventive concept includes an image processing unit 1100, a wireless transceiver unit 1200, an audio processing unit 1300, an image file generating unit 1400, an SRAM 1500, a user interface 1600, and a controller 1700.

The image processing unit 1100 includes a lens 1110, an image sensor 1120, an image processor 1130, and a display unit 1140. The wireless transceiver unit 1200 includes an antenna 1210, a transceiver 1220, and a modem 1230. The audio processing unit 1300 includes an audio processor 1310, a microphone 1320, and a speaker 1330.

The handheld terminal 1000 may include various types of semiconductor devices. For example, an application processor for performing functions of the controller 1700 may as well have low-power and high-performance characteristics. Accordingly, the controller 1700 may be implemented by a multi-core according to scale-down. The controller 1700 includes an SRAM 1750 that uses power in a dual power rail scheme according to an exemplary embodiment of the inventive concept. The SRAM 1750 uses the higher of a cell driving voltage VDDCE and a peripheral driving voltage VDDPE as a driving voltage of a memory cell according to a performance mode.

A system on chip according to an exemplary embodiment of the inventive concept may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention.

What is claimed is:

1. A system on chip, comprising:
an SRAM including at least one memory cell and a peripheral circuit accessing the at least memory cell;
a first power circuit configured to supply a first driving voltage to the at least one memory cell; and
a second power circuit configured to supply a second driving voltage to the peripheral circuit,
wherein the SRAM further includes an auto power switch that is configured to select the higher of the first driving voltage and the second driving voltage and supplies the selected voltage to the at least one memory cell.

2. The system on chip of claim 1, wherein the second power circuit is configured to vary a level of the second driving voltage according to a performance mode.

3. The system on chip of claim 2, wherein the auto power switch is configured to compare the first driving voltage with the second driving voltage in a high-speed mode.

4. The system on chip of claim 2, wherein in a low-speed mode, the auto power switch is configured to supply the first driving voltage to the at least one memory cell without a switch in voltage.

5. The system on chip of claim 1, further comprising:
a power controller configured to process a performance control signal of the SRAM to transfer the performance mode to the auto power switch and the second power circuit.

6. The system on chip of claim 1, wherein the auto power switch is configured to supply the first driving voltage to the at least one memory cell in response to a reset signal.

7. The system on chip of claim 1, wherein the auto power switch comprises:
a comparator configured to compare the first driving voltage with the second driving voltage; and
a transistor set configured to supply the first driving voltage or the second driving voltage to the at least one memory cell according to a result of the comparison.

8. The system on chip of claim 7, wherein the comparator is configured to selectively compare the first driving voltage with the second driving voltage according to a performance mode.

9. The system on chip of claim 7, wherein the comparator is configured to compare the first driving voltage with the second driving voltage in response to a selection signal for controlling the SRAM or a clock signal.

10. A method of supplying power to an SRAM, the method comprising:
- detecting a performance mode of the SRAM, wherein the SRAM is separately supplied with a cell driving voltage that is to be supplied to a memory cell and a peripheral driving voltage that is to be supplied to a peripheral circuit configured to access the memory cell;
- comparing the cell driving voltage with the peripheral driving voltage; and
- selecting the cell driving voltage or the peripheral driving voltage according to a result of the comparison, wherein the selected voltage is supplied as a power supply voltage of the memory cell, the selected voltage corresponding to the higher of the cell driving voltage and the peripheral driving voltage or a voltage having substantially the same level as the cell driving voltage and the peripheral driving voltage.

11. The method of claim 10, wherein comparing the cell driving voltage with the peripheral driving voltage is activated in a performance mode where a level of the peripheral driving voltage increases.

12. The method of claim 10, wherein the cell driving voltage is supplied as a power supply voltage of the memory cell in a performance mode where the peripheral driving voltage is lower than the cell driving voltage.

13. The method of claim 10, further comprising performing a reset operation according to a state of a reset signal, a selection signal, and/or a clock signal of the SRAM when booting the SRAM such that the cell driving voltage is fixed as a voltage for the memory cell.

14. The method of claim 10, wherein the SRAM is an intellectual property core included in a system on chip.

15. The method of claim 14, wherein the cell driving voltage and the peripheral driving voltage are supplied to the SRAM through a dual power rail.

16. A system on chip, comprising:
- a memory cell;
- a peripheral circuit configured to access the memory cell;
- a first power circuit configured to generate a first driving voltage;
- a second power circuit configured to generate a second driving voltage;
- a power controller configured to generate a performance mode signal; and
- an auto power switch configured to be activated or deactivated in response to the performance mode signal, wherein, when deactivated, the auto power switch is configured to supply the first driving voltage and the second driving voltage to the memory cell and the peripheral circuit, respectively, and when activated, the auto power switch is configured to supply the higher of the first driving voltage and the second driving voltage to the memory cell.

17. The system on chip of claim 1, wherein the auto power switch is configured to set the first driving voltage in response to a reset signal when the system on chip is booted.

18. The system on chip of claim 1, wherein the first driving voltage has a constant level regardless of the performance mode signal, and the second driving voltage has a level varying depending on the performance mode signal.

* * * * *